(12) United States Patent
Nguyen et al.

(10) Patent No.: US 10,658,029 B2
(45) Date of Patent: May 19, 2020

(54) HIGH BANDWIDTH DOUBLE-PUMPED MEMORY

(71) Applicant: QUALCOMM Incorporated, San Diego, CA (US)

(72) Inventors: Hoan Huu Nguyen, Cary, NC (US); Francois Ibrahim Atallah, Raleigh, NC (US); Keith Alan Bowman, Morrisville, NC (US); Hari Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/138,174

(22) Filed: Sep. 21, 2018

(65) Prior Publication Data

US 2020/0098422 A1  Mar. 26, 2020

(51) Int. Cl.
| | | |
|---|---|---|
| *G11C 11/4091* | (2006.01) | |
| *G11C 7/06* | (2006.01) | |
| *G11C 11/419* | (2006.01) | |
| *G11C 11/408* | (2006.01) | |
| *G11C 8/08* | (2006.01) | |
| *G11C 8/10* | (2006.01) | |
| *G11C 16/26* | (2006.01) | |

(52) U.S. Cl.
CPC ............ *G11C 11/419* (2013.01); *G11C 7/065* (2013.01); *G11C 8/08* (2013.01); *G11C 8/10* (2013.01); *G11C 11/4085* (2013.01); *G11C 11/4091* (2013.01); *G11C 16/26* (2013.01)

(58) Field of Classification Search
CPC ...... G11C 7/065; G11C 7/062; G11C 11/4091

USPC .................................................. 365/203, 208
See application file for complete search history.

(56) References Cited

U.S. PATENT DOCUMENTS

| | | | | | |
|---|---|---|---|---|---|
| 5,398,213 | A | * | 3/1995 | Yeon ...................... | G11C 7/103 365/238.5 |
| 5,659,512 | A | * | 8/1997 | Koyanagi ............ | G11C 7/1048 365/203 |
| 6,154,393 | A | * | 11/2000 | Otsuka ................. | G11C 7/1006 365/189.02 |
| 6,154,394 | A | * | 11/2000 | Hirabayashi ......... | G11C 7/1051 365/189.05 |

(Continued)

OTHER PUBLICATIONS

Gao M., et al., "TETRIS: Scalable and Efficient Neural Network Acceleration with 3D Memory," in Proc. ASPLOS, Apr. 2017, pp. 751-764.

(Continued)

*Primary Examiner* — Son L Mai
(74) *Attorney, Agent, or Firm* — Patterson & Sheridan, LLP

(57) ABSTRACT

Certain aspects of the present disclosure provide apparatus and methods for performing memory read operations. One example method generally includes precharging a plurality of memory columns during a precharging phase of a read access cycle. The method also includes sensing first data stored in a first memory cell of a first memory column of the plurality of memory columns during a memory read phase of the read access cycle, and sensing second data stored in a second memory cell of a second memory column of the plurality of memory columns during the same memory read phase of the read access cycle.

19 Claims, 7 Drawing Sheets

(56) References Cited

U.S. PATENT DOCUMENTS

| | | | | |
|---|---|---|---|---|
| 6,597,626 B2* | 7/2003 | Hirabayashi | ............ | G11C 7/065 |
| | | | | 365/194 |
| 7,254,072 B2* | 8/2007 | Kuroda | ................ | G11C 7/1048 |
| | | | | 365/203 |
| 7,590,010 B2* | 9/2009 | Park | ......................... | G11C 7/06 |
| | | | | 365/189.05 |

OTHER PUBLICATIONS

Han S., et al., "EIE: Efficient Inference Engine on Compressed Deep Neural Network," in Proc. ISCA, Jun. 2016, pp. 243-254.

Wu S.-Y., et al., "A 7nm CMOS Platform Technology Featuring 4th Generation FinFET Transistors with a 0.027um2 High Density 6-T SRAM Cell for Mobile SoC Applications," in IEDM Dig. Tech. Papers, Dec. 2016, pp. 43-46.

* cited by examiner

HIGH BANDWIDTH DOUBLE-PUMPED MEMORY

TECHNICAL FIELD

The teachings of the present disclosure relate generally to memory, and more particularly, to techniques for memory read operations.

INTRODUCTION

A static random-access memory (SRAM) is a type of semiconductor memory that uses latching circuitry to store data. An SRAM includes an array of memory cells, each of which corresponds to a column and a word line. A decoder may be used to select a column and a word line to read data from a corresponding memory cell. Certain digital signal processors (DSPs) and neural processor units (NPUs) have a peak bandwidth (BW) of two kilobytes per read access, which may be implemented with, for example, 256 active SRAM instances per access cycle.

BRIEF SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure provide a method for performing memory read operations. The method generally includes precharging a plurality of memory columns during a precharging phase of a read access cycle, sensing first data stored in a first memory cell of a first memory column of the plurality of memory columns during a memory read phase of the read access cycle, and sensing second data stored in a second memory cell of a second memory column of the plurality of memory columns during the same memory read phase of the read access cycle.

Certain aspects of the present disclosure provide a memory. The memory generally includes a plurality of memory columns, a sense amplifier having an input selectively coupled to the plurality of memory columns, and at least two latch circuits coupled to an output of the sense amplifier.

Certain aspects of the present disclosure provide a memory. The memory generally includes a precharging circuit configured to precharge a plurality of memory columns during a precharging phase of a read access cycle; and a sense amplifier configured to sense first data stored in a first memory cell of a first memory column of the plurality of memory columns during a memory read phase of the read access cycle; and sense second data stored in a second memory cell of a second memory column of the plurality of memory columns during the same memory read phase of the read access cycle.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
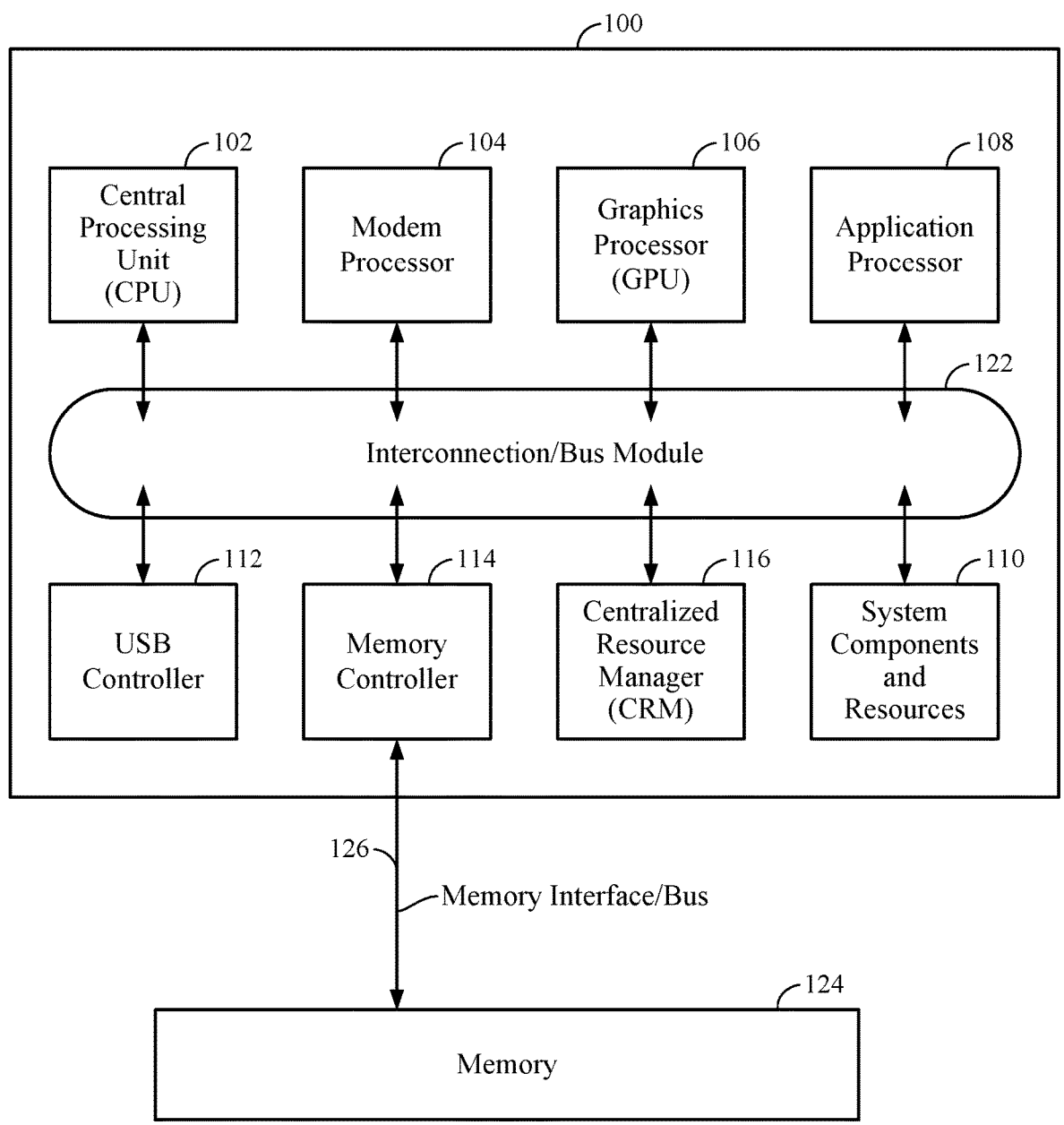
FIG. 1 is an illustration of an exemplary system-on-chip (SoC) integrated circuit design, in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors, modem processors, video processors, etc.), memory blocks (e.g., ROM, RAM, Flash, etc.), and resources (e.g., timers, voltage regulators, oscillators, etc.), any or all of which may be included in one or more cores.

A number of different types of memories and memory technologies are available or contemplated in the future, all of which are suitable for use with the various aspects of the present disclosure. Such memory technologies/types include dynamic random-access memory (DRAM), static random-access memory (SRAM), non-volatile random-access memory (NVRAM), flash memory (e.g., embedded multimedia card (eMMC) flash), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies includes, for example, elements suitable for storing instructions, programs, control signals, and/or data for use in or by a computer or other digital electronic device. Any references to terminology and/or technical details related to an individual type of memory, interface, standard or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock-rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and wireless data transmissions, and for performing other specialized operations (e.g., decoding high-definition video, video processing, etc.). System components and resources 110 may also include components such as voltage regulators, oscillators, phase-locked loops, peripheral bridges, data controllers, system controllers, access ports, timers, and other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks-on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 (e.g., eMMC flash memory) via a memory interface/bus 126. For example, the memory controller 114 may comprise one or more processors configured to perform operations disclosed herein. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100. In certain aspects, the memory 124 may be implemented as an SRAM which may be read using a double-pump read operation as described in more detail herein.

Example High Bandwidth Double-Pumped Memory

Artificial intelligence (AI) and other relatively high utilizations of memory continue to be employed in an increasing number of technology applications. Therefore, computing devices that can support the bandwidth involved for corresponding computations of AI and other applications are important. One key aspect of achieving AI is the implementation of machine learning (ML). ML processors contain a large array of multiply-accumulate (MAC) units executing in parallel to achieve high throughput. This level of parallelism uses on-die memories with ultra-high bandwidth to maintain a high-utilization rate across the MAC units.

The highly sequential nature of ML memory access where large contiguous chunks of memory are read out per memory access is inefficient for the random-access nature for which traditional static random access memories (SRAM) are designed. Certain aspects of the present disclosure provide an SRAM-based memory architecture that provides double the memory bandwidth per read access cycle while exploiting the sequential nature of ML memory access to reduce power and bank conflicts compared to conventional SRAM implementations.

In conventional SRAM implementations for performance, area, and power reasons, multiple memory columns of memory share a sense amplifier for reading operations. For example, in some cases, four memory columns may share a single sense amplifier. During each read access cycle, all memory columns of the memory may be precharged. After one of the word lines of the memory columns is asserted, one out of the four memory columns is selected via a memory column select address to be read. Thus only one column may be read per read access cycle in conventional SRAM implementations. Certain aspects of the present disclosure exploit the sequential nature of ML memory access to read out multiple memory columns instead of only one memory column.

To enable high bandwidth features in an SRAM, global read bitlines and output flip-flops may be duplicated to enable parallel evaluation of multiple (e.g., two) memory columns per read access cycle, as described in more detail herein. For example, per read access cycle, two memory columns may be read, one earlier in time and one later in time during the same read access cycle. For the early read, a memory column may be selected, the sense amplifier may be precharged, and the true and complementary bitlines of the selected memory column may be sensed by the sense amplifier. The output of the sense amplifier may be stored in a latch (e.g., a cross-coupled hold latch) to reduce the sense amplifier hold time. The sense amplifier may then be precharged again, and another memory column may be selected. The true and complementary bitlines of the other selected memory column may then be passed to the sense amplifier for evaluation for the later read during the same read access cycle.

Figure 2:
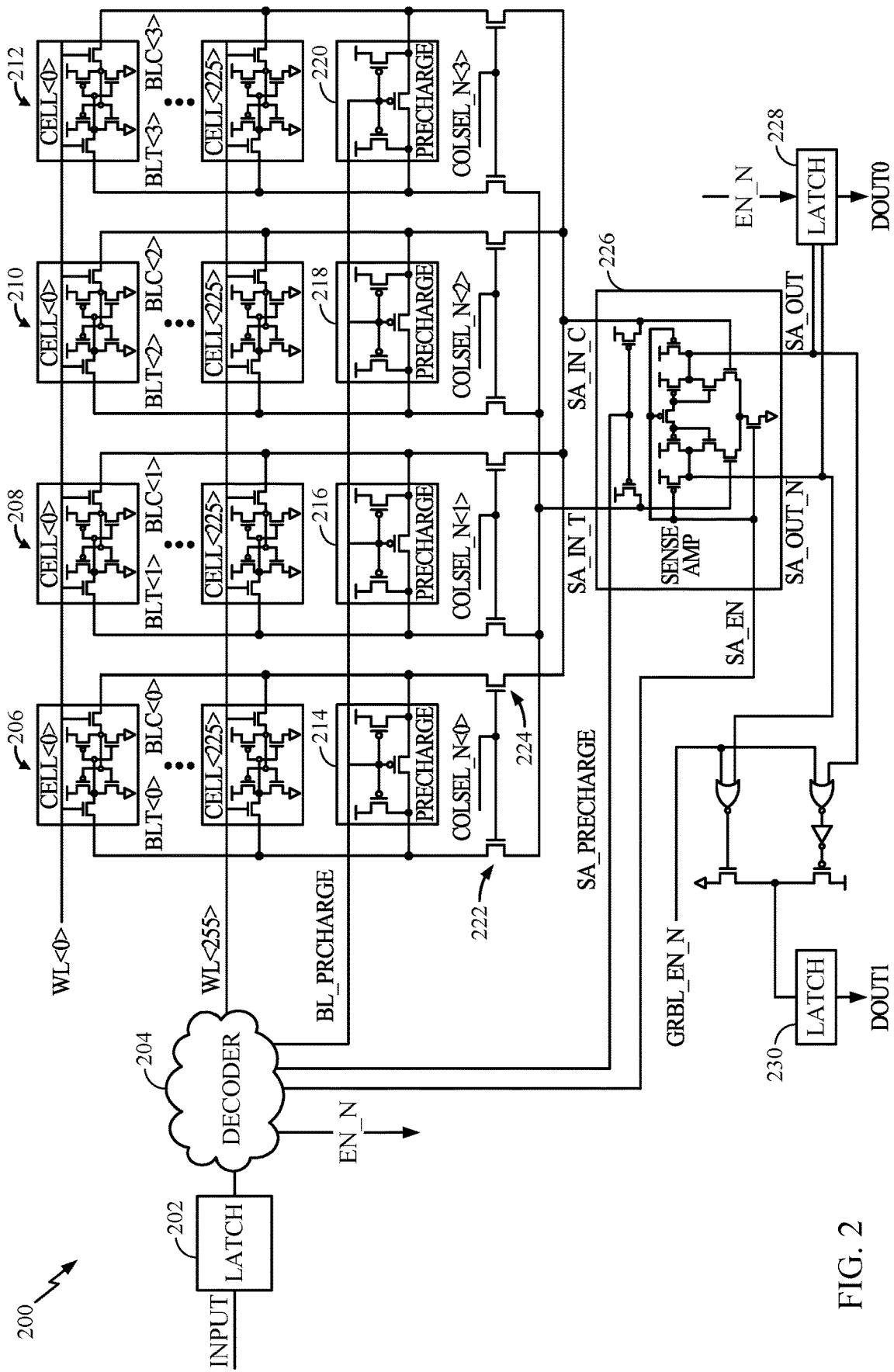
FIG. 2 illustrates an example static random-access memory (SRAM) architecture, in accordance with certain aspects of the present disclosure.

FIG. 2 illustrates an example SRAM architecture 200, in accordance with certain aspects of the present disclosure. In certain aspects, the memory 124 described with respect to FIG. 1 may be implemented using the architecture described with respect to FIG. 2. The SRAM architecture 200 includes a latch 202 for latching input data and a decoder 204 for controlling memory operations. In certain aspects, the decoder 204 may be correspond to the memory controller 114 described with respect to FIG. 1.

The SRAM architecture 200 includes multiple memory columns 206, 208, 210, 212, each having multiple memory cells (e.g., 256 cells, designated as CELL<0> to CELL<255>) coupled to a true bitline (BLT) and a complementary bitline (BLC). Although the example SRAM architecture 200 illustrates four columns to facilitate understanding, aspects of the present disclosure may be implemented with more or less than four columns. The memory columns 206, 208, 210, 212 are connected to multiple word lines (e.g., 256 word lines, designated as WL<0> to WL<255>), as illustrated. Each of the memory columns 206, 208, 210, 212 includes precharge circuitry 214, 216, 218, 220 to precharge the respective memory column during read operations.

Column-select switches 222, 224 (e.g., implemented as transistors) may be included in each of the memory columns 206, 208, 210, 212 to allow for the memory columns 206, 208, 210, 212 to be selectively coupled to a sense amplifier 226 during a sensing phase. In this manner, the column-select switches 222, 224 may function as a multiplexer (MUX) between the memory columns 206, 208, 210, 212 and the sense amplifier 226. For example, memory column 206 includes switches 222 and 224 having gates coupled to a memory column select (COLSEL_N<O>) node, as illustrated. As illustrated, the SRAM architecture 200 includes multiple latch circuits 228, 230, allowing for multiple memory columns to be read after each precharge cycle and during the same read access cycle, as described in more detail herein.

Figure 3:
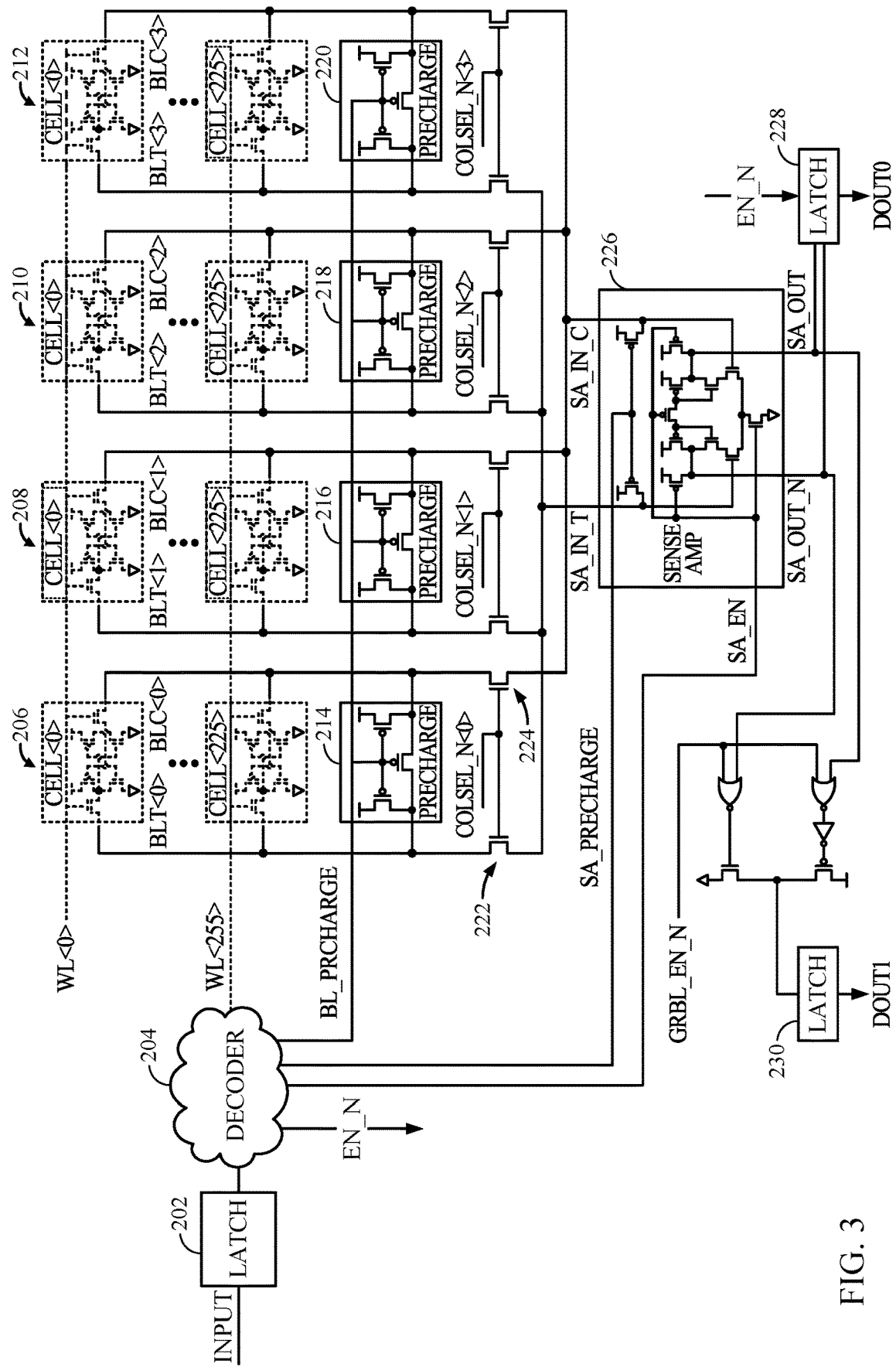
FIG. 3 illustrates the SRAM architecture of FIG. 2 during a precharge phase, in accordance with certain aspects of the present disclosure.

FIG. 3 illustrates the SRAM architecture 200 during a precharge phase, in accordance with certain aspects of the present disclosure. During the precharge phase, the decoder 204 enables the precharge circuitry 214, 216, 218, 220 via the precharge bit-line (BL_PRCHARGE) signal to precharge the BLT and BLC of each of the memory columns 206, 208, 210, 212. The precharge circuitry 214, 216, 218, 220 precharges the parasitic capacitances of the BLT and BLC prior to one or more of the memory columns 206, 208, 210, 212 being enabled for data sensing.

The decoder 204 also precharges the sense amplifier 226 via the sense amplifier precharge (SA_PRECHARGE) signal, as illustrated. Therefore, during the precharge phase, the sense amplifier BLT input (SA_IN_T) and the sense amplifier BLC input (SA_IN_C) are precharged, prior to one or more of the memory columns 206, 208, 210, 212 being enabled for data sensing during a sensing phase.

Figure 4:
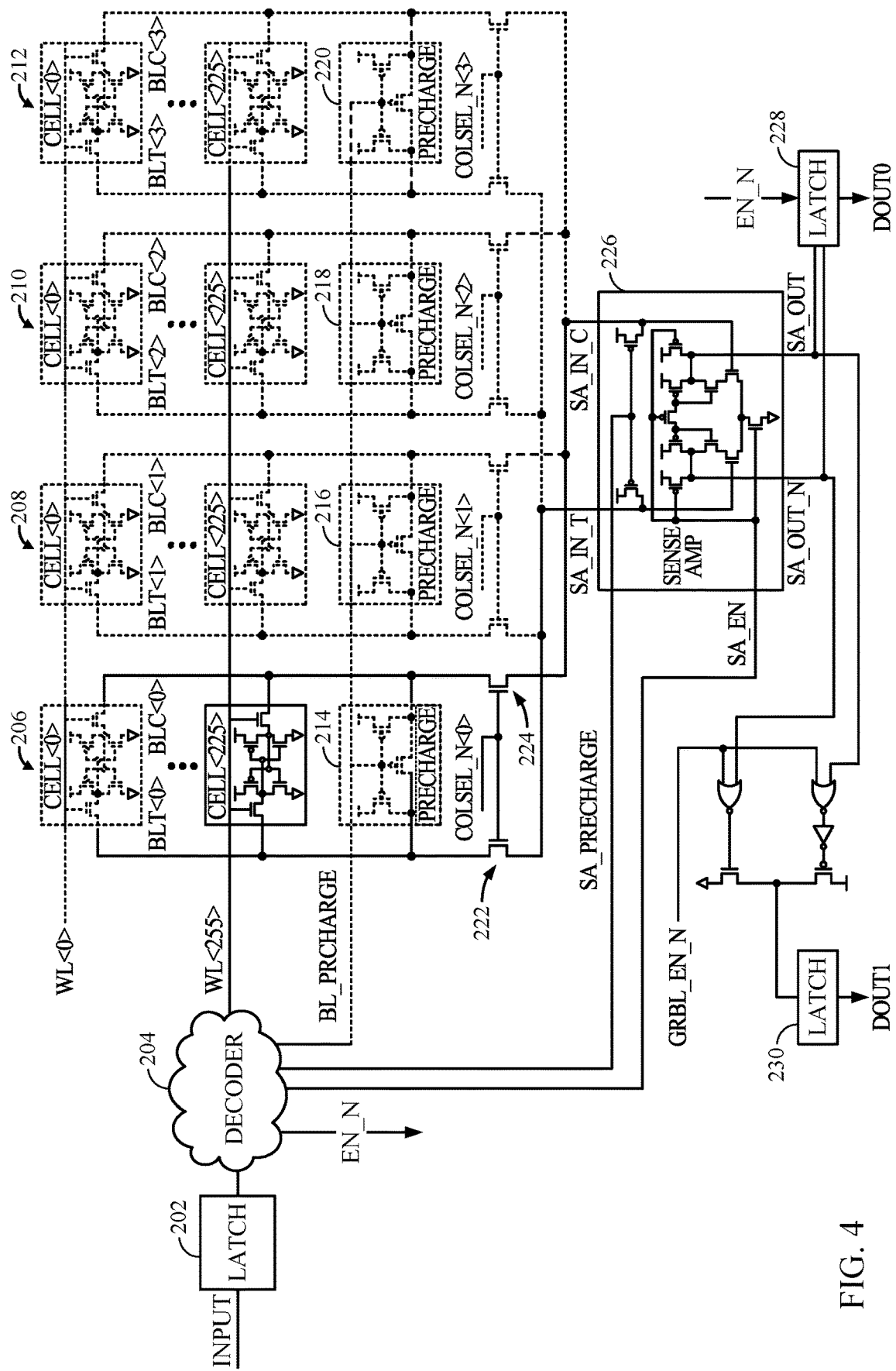
FIGS. 4 and 5 illustrate the SRAM architecture of FIG. 2 at two different instances during a sensing phase, in accordance with certain aspects of the present disclosure.
Figure 5:
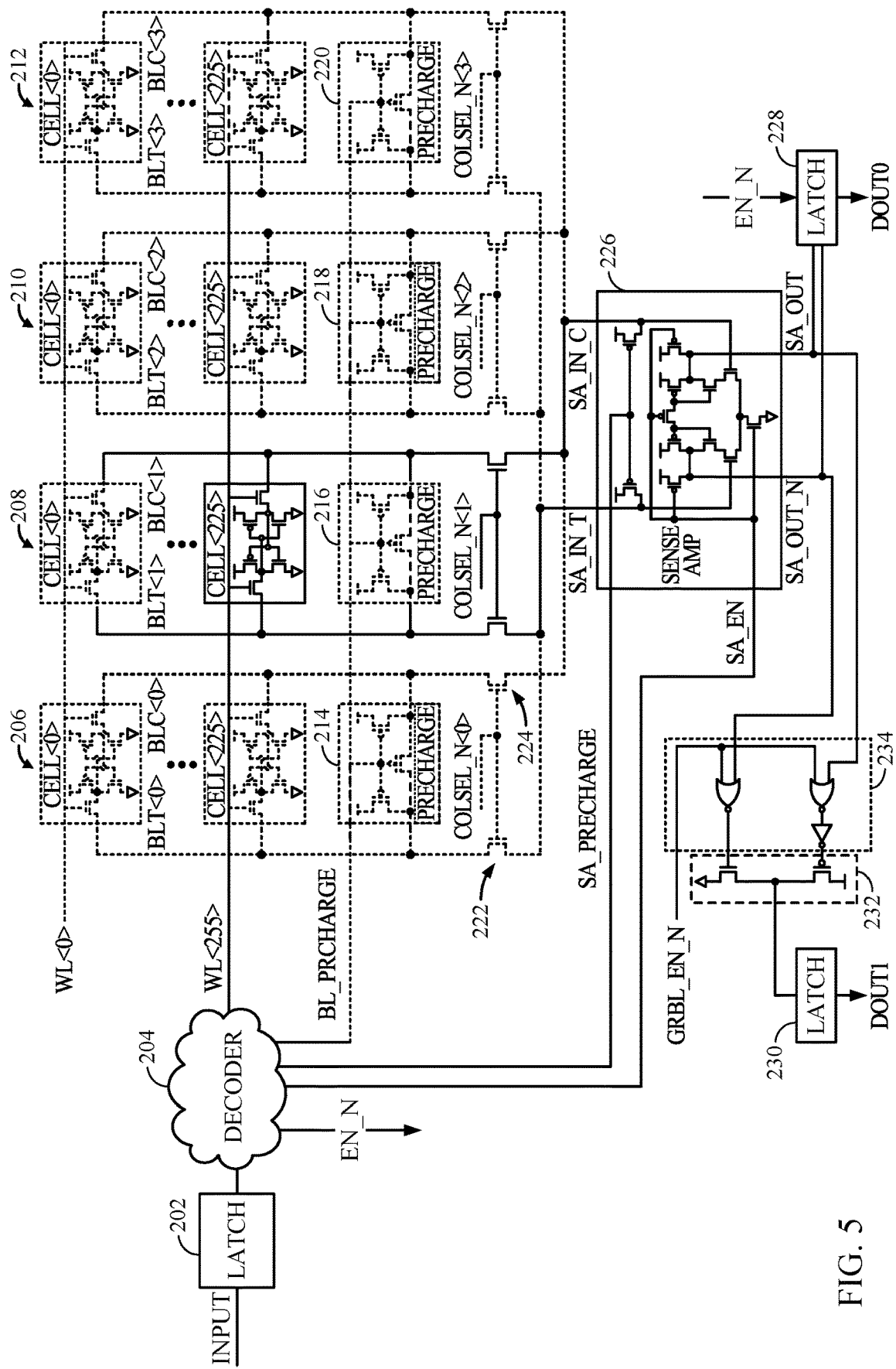

FIGS. 4 and 5 illustrate the SRAM architecture 200 at two different instances (an earlier read and a later read, respectively) during a sensing phase (also referred to herein as a "memory read phase"), in accordance with certain aspects of the present disclosure. As illustrated in FIG. 4, one of the memory columns 206, 208, 210, 212 is selected via a memory column select (COLSEL) signal, as illustrated. For example, the COLSEL_N<0> signal may be controlled via the decoder 204 to select memory column 206, coupling the memory cells of memory column 206 to the sense amplifier 226 by closing switches 222 and 224.

The decoder 204 also selects one of the word lines (e.g., WL<255>), as illustrated. The decoder 204 enables the sense amplifier 226 via the sense amplifier enable (SA_EN) signal in order for the sense amplifier 226 to sense the bit value stored in the memory cell (CELL<255>) corresponding to the selected memory column 206 and the selected word line (WL<255>). The sensed bit value is stored in a latch circuit 228. For example, the latch circuit 228 may be enabled, by the decoder 204, via an enable signal (EN_N) for the latch circuit 228 to store the bit value at the output of the sense amplifier. In certain aspects, the latch circuit 228 may be implemented as a cross-coupled NOR latch. In certain aspects, after the data from memory column 206 is latched, the sense amplifier may be disabled.

Once the data from the memory column 206 is sensed and latched, the sense amplifier 226 may be precharged once again, and another memory column may be selected. For example, as illustrated in FIG. 5, the decoder 204 may select memory column 208 via the COLSEL_N<1> signal, and select one of the word lines (e.g., WL<255>), as illustrated. In certain aspects, the same word line (WL<255>) that is selected when reading memory column 206 may also be selected when reading memory column 208, but a different word line may alternatively be selected. If the same word line is selected for the read operations of both memory columns 206 and 208, the word line (e.g., WL<255>) may remain selected throughout the read operations of both memory columns 206 and 208.

In certain aspects, the bit value corresponding to CELL<255> of memory column 208 may be stored via latch circuit 230. For example, the decoder 204 may set the global bit-line enable (GRBL_EN_N) signal such that the output signal of the sense amplifier 226 drives the gates of transistors of a push-pull circuit 232 via the logic gates 234. The output of the push-pull circuit 232 is then stored via the latch circuit 230. Thus, the output of the latch circuit 228 represents a first digital value (DOUT0) corresponding to memory column 206 for the WL<255>, the output of the latch circuit 230 represents a second digital value (DOUT1) corresponding to memory column 208 for the WL<255>.

Figure 6:
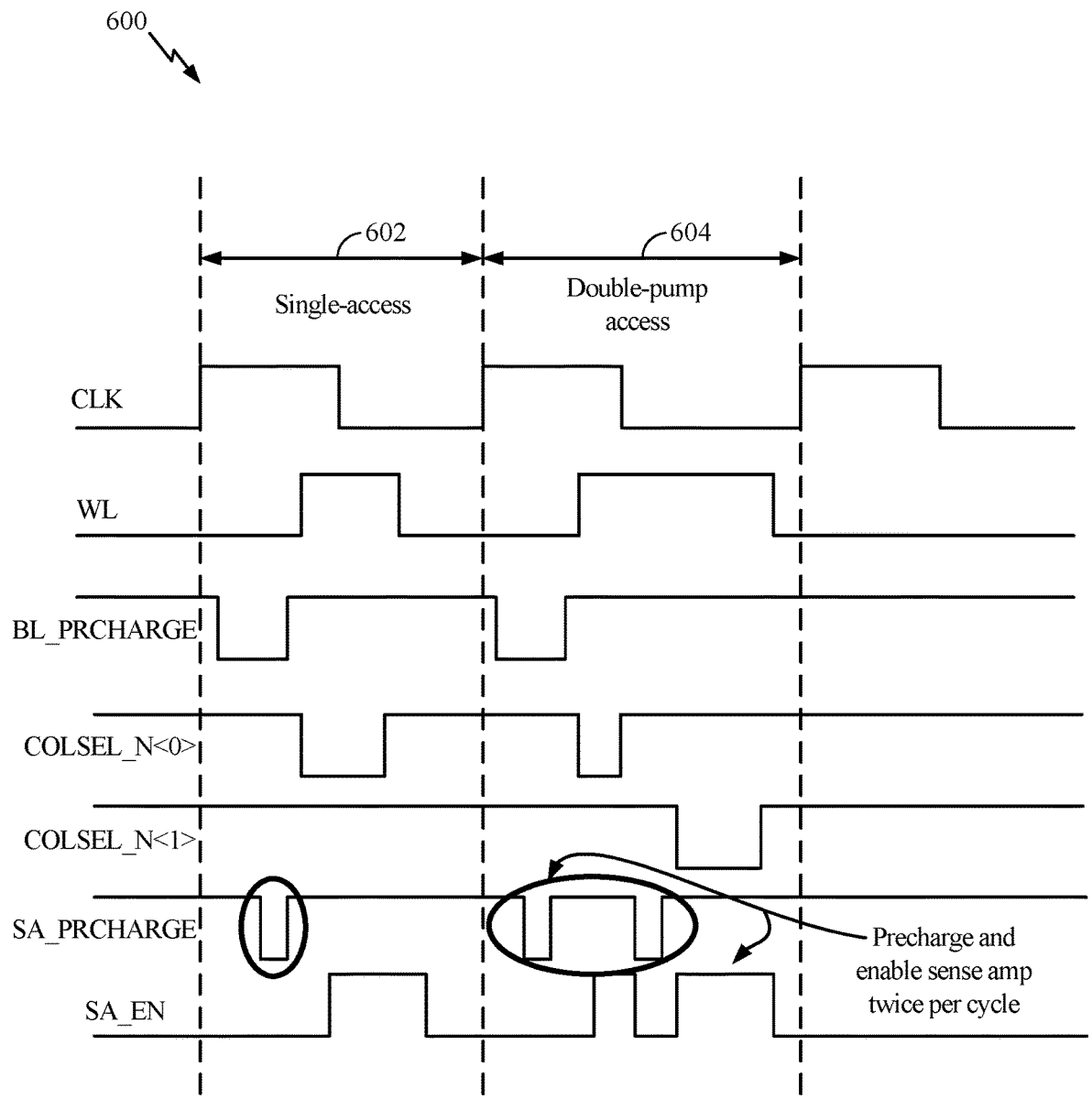
FIG. 6 is a timing diagram illustrating a timing diagram contrasting a single read access and a double-pump read access, in accordance with certain aspects of the present disclosure.

FIG. 6 is a timing diagram 600 illustrating a timing sequence corresponding to a single read access and a double-pumped read access, in accordance with certain aspects of the present disclosure. During a read access cycle 602, a single-access read operation may be performed, and during the read access cycle 604, a double-pumped read operation may be performed as described with respect to FIGS. 2-5. Each of the read access cycles 602, 604 corresponds to a single clock (CLK) period of the decoder 204, as illustrated.

During both read access cycles 602, 604, the BL_PR-CHARGE signal and the SA_PRCHARGE signal are set to logic low, enabling the precharge circuitry 214, 216, 218, 220 and precharging the sense amplifier 226 as described with respect to FIG. 3. The decoder 204 then selects the word line (e.g., WL<255>) by setting the WL signal to logic high, and selects memory column 206 by setting the COL-SEL_N<0> signal to logic low. During the read access cycle 602, note that only one memory column selection is made (e.g., COLSEL_N<1> remains logic high throughout the cycle). The sense amplifier 226 is then enabled by setting the SA_EN signal to logic high to sense the bit value stored in the memory cell corresponding to memory column 206 and WL<255>.

During the read access cycle 602, once the bitlines are precharged and the word line (e.g., WL<255>) has been selected, the word line remains selected while a memory cell from a single memory column is read by precharging and enabling the sense amplifier 226. During the read access cycle 604, two memory cells from two memory columns (e.g., memory columns 206, 208) are read sequentially by precharging and enabling the sense amplifier twice, as described with respect to FIGS. 3-5. For example, once the bitlines (BLT and BLC of memory column 206) and the sense amplifier 226 are precharged, the word line (e.g., WL<255>) is selected, and the sense amplifier 226 is enabled to read the bit value of the memory cell (CELL<255>) corresponding to memory column 206 and WL<255>. Then, the COLSEL_N<0> signal is deasserted (e.g., returns to logic high), another memory column (e.g., memory column 208) is selected via the COLSEL_N<1> signal, the sense amplifier 226 is precharged again, and the sense amplifier 226 is enabled to read the bit value of the memory cell (CELL<255>) corresponding to memory column 208 and WL<255>. The double-pump read operations performed during the read access cycle 604 increase the access bandwidth while reducing the read access power consumption of the SRAM architecture as compared to the single-access read operations.

Figure 7:
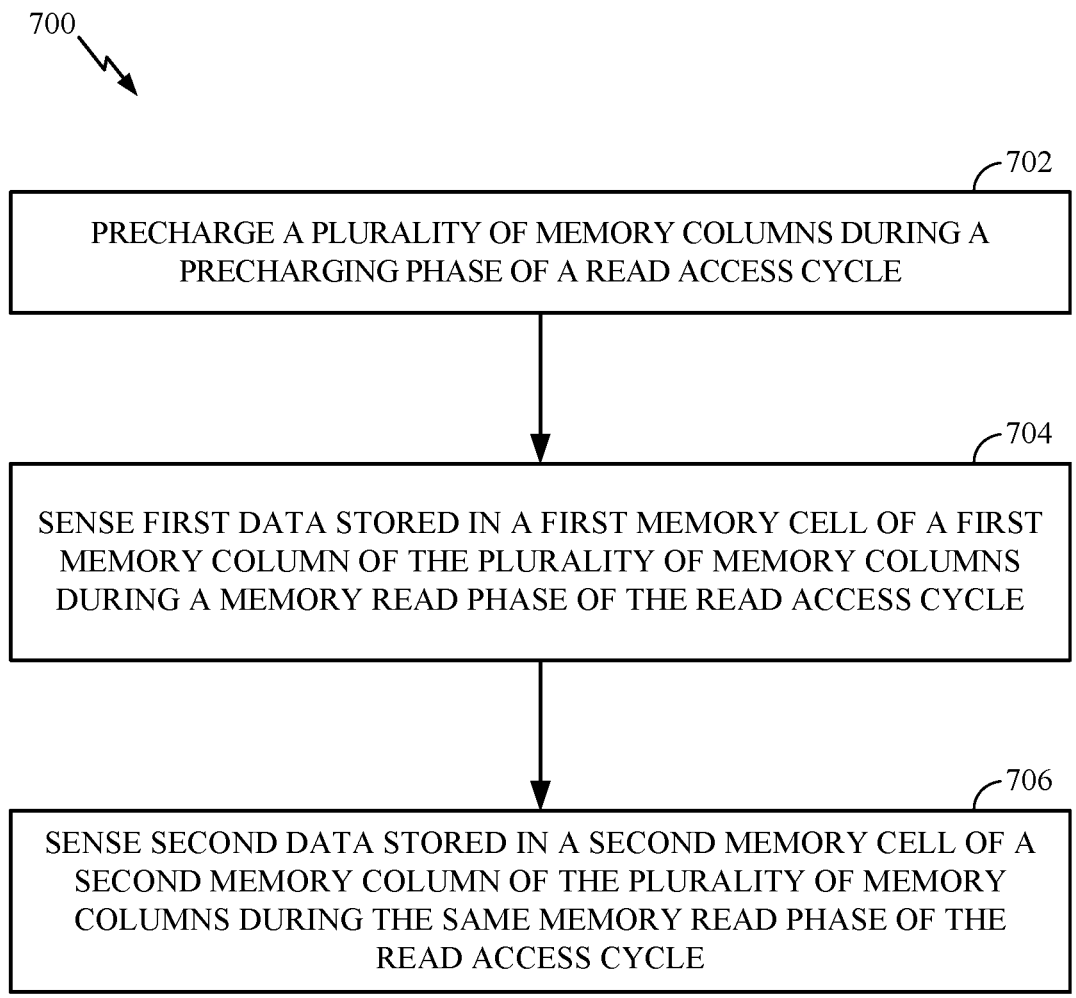
FIG. 7 is a flow diagram illustrating example operations for performing memory read operations, in accordance with certain aspects of the present disclosure.

FIG. 7 is a flow diagram illustrating example operations 700 for performing memory read operations, in accordance with certain aspects of the present disclosure. The operations 700 may be performed by a memory architecture, such as the SRAM architecture 200.

The operations 700 begin, at block 702, by precharging a plurality of memory columns (e.g., memory columns 206, 208, 210, 212) during a precharging phase of a read access cycle (e.g., read access cycle 604). At block 704, the operations 700 involve sensing first data stored in a first memory cell of a first memory column (e.g., memory column 206) of the plurality of memory columns during a memory read phase of the read access cycle. At block 706, the operations 700 continue by sensing second data stored in a second memory cell of a second memory column (e.g., memory column 208) of the plurality of memory columns during the same memory read phase of the read access cycle.

In certain aspects, the sensing of the first data and the sensing of the second data are performed via a sense amplifier (e.g., sense amplifier 226). In this case, the operations 700 may also include precharging the sense amplifier prior to the sensing of the first data. In this case, the operations 700 may also include precharging the sense amplifier prior to the sensing of the second data.

In certain aspects, the operations 700 also include storing the sensed first data prior to the sensing of the second data. In certain aspects, the sensed first data is stored in a first latch circuit (e.g., latch circuit 228). In this case, the operations 700 may further include storing the sensed second data in a second latch circuit (e.g., latch circuit 230).

In certain aspects, the first memory cell and the second memory cell are associated with the same word line (e.g., WL<255>). In this case, the operations 700 may also include selecting the word line prior to the sensing of the first data and the sensing of the second data.

The double-pump operations described herein may reduce the number of memory banks that may be implemented for certain operations (e.g., machine learning operations), lowering system level memory area and power consumption. The double-pump operations described herein may also reduce the number of active instances per access cycle, reducing power consumption and read write conflicts, leading to higher average bandwidth.

In some configurations, the term(s) "communicate," "communicating," and/or "communication" may refer to "receive," "receiving," "reception," and/or other related or suitable aspects without necessarily deviating from the scope of the present disclosure. In some configurations, the term(s) "communicate," "communicating," "communication," may refer to "transmit," "transmitting," "transmission," and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features, and/or functions illustrated herein may be rearranged and/or combined into a single component, step, feature, or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The apparatus and methods described in the detailed description are illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary aspects, the functions described may be implemented in hardware, software, or combinations thereof. If implemented in software, the functions may be stored on or encoded as one or more instructions or code on a computer-readable medium. Computer-readable media may include computer storage media. Computer storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

What is claimed is:

1. A method for performing memory read operations, comprising:
    precharging a plurality of memory columns during a precharging phase of a read access cycle;
    sensing first data stored in a first memory cell of a first memory column of the plurality of memory columns during a memory read phase of the read access cycle; and
    sensing second data stored in a second memory cell of a second memory column of the plurality of memory columns during the same memory read phase of the read access cycle.

2. The method of claim 1, wherein the sensing of the first data and the sensing of the second data are performed via a sense amplifier, the method further comprising precharging the sense amplifier a first time prior to the sensing of the first data and during the read access cycle.

3. The method of claim 2, further comprising precharging the sense amplifier a second time prior to the sensing of the second data and during the read access cycle.

4. The method of claim 1, further comprising storing the sensed first data prior to the sensing of the second data.

5. The method of claim 4, wherein the sensed first data is stored in a first latch circuit, the method further comprising storing the sensed second data in a second latch circuit.

6. The method of claim 1, wherein the first memory cell and the second memory cell are associated with the same word line, the method further comprising selecting the word line prior to the sensing of the first data and the sensing of the second data.

7. A memory comprising:
    a plurality of memory columns;
    a sense amplifier having an input selectively coupled to the plurality of memory columns; and
    at least two latch circuits coupled to an output of the sense amplifier, wherein:

each of the plurality of memory columns comprises a precharge circuit, the precharge circuits configured to precharge the plurality of memory columns during a precharging phase of a read access cycle; and the sense amplifier is configured to:

sense first data stored in a first memory cell of a first memory column of the plurality of memory columns during a memory read phase of the read access cycle; and sense second data stored in a second memory cell of a second memory column of the plurality of memory columns during the same memory read phase of the read access cycle.

8. The memory of claim 7, further comprising a decoder configured to enable precharging of the sense amplifier a first time, prior to the sensing of the first data and during the read access cycle.

9. The memory of claim 8, wherein the decoder is configured to enable precharging of the sense amplifier a second time, prior to the sensing of the second data and during the read access cycle.

10. The memory of claim 7, wherein the at least two latch circuits comprise a first latch circuit configured to store the sensed first data and a second latch circuit configured to store the sensed second data.

11. The memory of claim 10, wherein the first latch circuit is configured to store the sensed first data prior to the sensing of the sensed second data.

12. The memory of claim 7, wherein the first memory cell and the second memory cell are associated with the same word line, the memory further comprising a decoder configured to select the word line prior to the sensing of the first data and the sensing of the second data.

13. The memory of claim 7, wherein the memory comprises a static random-access memory (SRAM).

14. A memory comprising:

a precharging circuit configured to precharge a plurality of memory columns during a precharging phase of a read access cycle; and a sense amplifier configured to:

sense first data stored in a first memory cell of a first memory column of the plurality of memory columns during a memory read phase of the read access cycle; and sense second data stored in a second memory cell of a second memory column of the plurality of memory columns during the same memory read phase of the read access cycle.

15. The memory of claim 14, further comprising a decoder configured to enable precharging of the sense amplifier prior to the sensing of the first data.

16. The memory of claim 15, wherein the decoder is further configured to enable precharging of the sense amplifier prior to the sensing of the second data.

17. The memory of claim 14, further comprising a first latch circuit configured to store the sensed first data prior to the sensing of the second data.

18. The memory of claim 17, further comprising a second latch circuit configured to store the sensed second data.

19. The memory of claim 14, wherein the first memory cell and the second memory cell are associated with the same word line, the memory further comprising a decoder configured to select the word line prior to the sensing of the first data and the sensing of the second data.

* * * * *